United States Patent
Pasqualini (10) Patent No.: US 6,710,432 B1
(45) Date of Patent: Mar. 23, 2004

(54) INTEGRATED CIRCUIT PACKAGE WITH LOW INDUCTANCE GROUND PATH AND IMPROVED THERMAL CAPABILITY

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/053,489

(22) Filed: Nov. 2, 2001

(51) Int. Cl.[7] .............................................. H01L 23/495
(52) U.S. Cl. ........................................ 257/676; 257/666
(58) Field of Search ................................. 257/676, 666, 257/672

(56) References Cited

U.S. PATENT DOCUMENTS

| | | | |
|---|---|---|---|
| 5,854,511 A | * 12/1998 | Shin et al. ................... | 257/713 |
| 5,877,552 A | 3/1999 | Chiang ........................ | 257/706 |
| 5,892,274 A | 4/1999 | Buschbom ................... | 257/696 |
| 5,939,781 A | 8/1999 | Lacap ......................... | 257/698 |
| 6,034,423 A | 3/2000 | Mostafazadeh et al. ...... | 257/691 |
| 6,093,960 A | 7/2000 | Tao et al. .................... | 257/706 |
| 6,166,430 A | * 12/2000 | Yamaguchi .................. | 257/666 |
| 6,208,023 B1 | * 3/2001 | Nakayama et al. .......... | 257/696 |
| 6,420,779 B1 | * 7/2002 | Sharma et al. ............... | 257/666 |
| 6,437,427 B1 | * 8/2002 | Choi ........................... | 257/666 |
| 2002/0017706 A1 | * 2/2002 | Sone ........................... | 257/676 |
| 2002/0027297 A1 | * 3/2002 | Ikenaga et al. .............. | 257/784 |

OTHER PUBLICATIONS

Product Description: ASAT® "Exposed Die Pad Package" (EPP), 1 Page, Mar. 25, 1998.
Product Description: PSOP 2 and PSOP 3.

* cited by examiner

*Primary Examiner*—Phat X. Cao
(74) *Attorney, Agent, or Firm*—Beyer Weaver & Thomas, LLP (57) ABSTRACT

An integrated circuit (IC) package is described. In all package embodiments, a very low inductance ground path is provided from the on-die ground pads to the PCB ground plane. This very low inductance ground path can minimize electrical ground bounce to the point where it is no longer a significant problem. Ground path inductance is minimized by utilizing short downbond wires to a metal slug which acts as a very low inductance die attach pad (DAP). By extending the thickness of the DAP so that it protrudes below the bottom surface of the IC package, and by providing cutouts in the PCB, all IC package pins can be automatically self-aligned to their corresponding PCB "pads". Furthermore, the need for dedicated ground pins on the IC package is completely eliminated, significantly increasing the number of I/O pins available. In addition, the thickness and size of the DAP provide significant cooling capacity for the IC die. Finally, in those cases where maximum cooling capacity is needed, an external heat sink can be affixed to the exposed metal DAP, which extends through the bottom surface of the PCB.

8 Claims, 7 Drawing Sheets

INTEGRATED CIRCUIT PACKAGE WITH LOW INDUCTANCE GROUND PATH AND IMPROVED THERMAL CAPABILITY

FIELD OF THE INVENTION

The present invention relates to integrated circuit (IC) packages and methods for fabricating them. More specifically, the present invention comprises an IC package with a very low inductance ground path to a printed circuit board ground plane, wherein the same structure that provides the low inductance ground path also provides a significantly improved thermal conduction path.

BACKGROUND OF THE INVENTION

Figure 1:
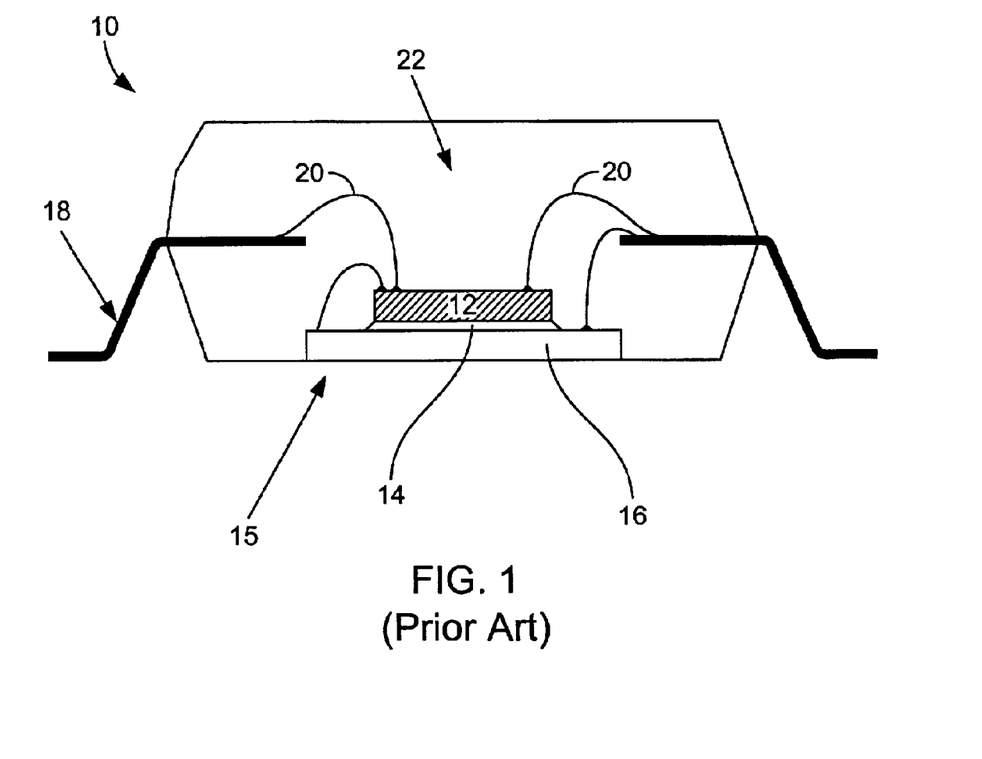
FIG. 1 is a cross-sectional view of a first known integrated circuit (IC) package (Prior Art)

A known integrated circuit (IC) package, with an exposed die attach pad (DAP), is shown in FIG. 1. IC package 10 consists of IC die 12 mounted on die attach pad 16 by means of a attach epoxy 14. IC die 12 is coupled to the input/output pins of metal lead frame 18 by means of a plurality of bond wires 20. A molded IC body 22 is then formed around IC die 12 an lead frame 18 in a known manner to complete the package. As shown in FIG. 1, lower surface 15 of die attach pad 16 remains exposed and co-planar with the leads of lead frame 18 after IC package 10 is completed.

Although IC package 10 is adequate for many purposes, as the operating frequencies of packaged IC dies have increased, several shortcomings of this type of package have emerged. In ICs that contain a large number of fast input/output (I/O) cells, many of the I/O cells can switch states at the same time, or nearly at the same time. This event is referred to as the "simultaneously switching output" (SSO) condition.

SSO conditions can cause very high ground bounce to occur on a (shared) on-die ground line which connects multiple I/O cells to the same (shared) on-die ground pad, which is then connected to a (shared) IC package ground pin. Ideally, the voltage on a shared on-die ground line should remain at zero volts when the I/O cells connected to this line switch from the logic high state to the logic low state. However, the bond wires and the lead frame that couple the on-die ground line to an external PCB ground plane present a collective I/O pin inductance. Rising/falling I/O cell currents, which must flow through this inductance, can cause the voltage on the on-die ground line to temporarily rise and/or fall above/below zero volts. These momentary voltage changes are often referred to as "ground bounce." In the worst case, high ground bounce can cause an IC to malfunction. For example, in ICs which contain analog circuitry, high ground bounce can cause the analog circuitry to generate degraded and/or erroneous waveforms. Furthermore, high ground bounce can also cause digital I/O cells, which are trying to output a logic low level, to temporarily output a logic high level. This temporary "glitch" condition can easily cause system malfunction.

Ground bounce depends upon a number of factors, including the total inductance from an on-die ground pad to the PCB ground plane. This total inductance includes all wire inductance plus the inductance of the package lead frame. Ground bounce can be minimized by minimizing the total inductance from an on-die ground pad to the PCB ground plane. If the total inductance could be reduced to zero, then ground bounce would also be reduced to zero.

Figure 2A:
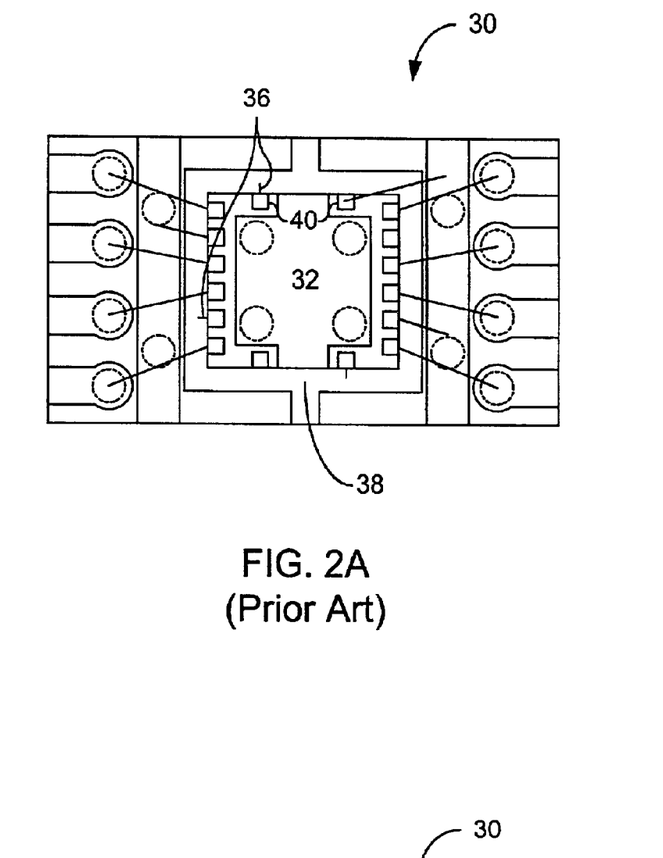
FIGS. 2a and 2b are, respectively, a top view and a cross-sectional view of a second known IC package (Prior Art)
Figure 2B:
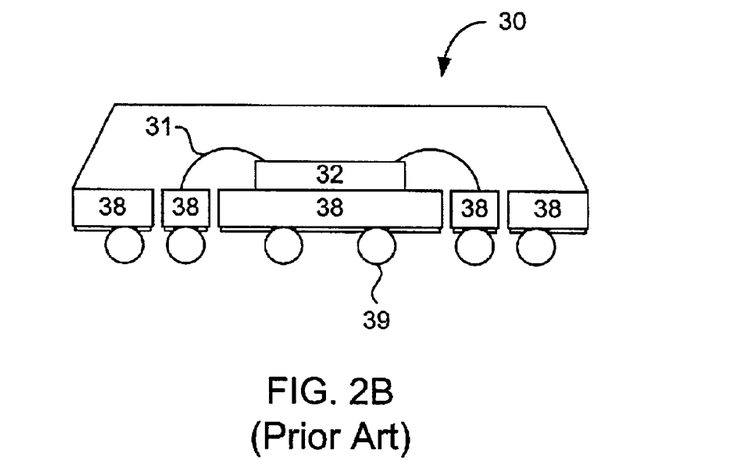

As shown in FIGS. 2a and 2b, another known type of IC package, a plastic ball grid array (PBGA) offers a very direct connection to the ground plane of a PCB. PBGA IC package 30 has an IC die 32 mounted on a substrate 38 using a silver epoxy or other suitable attachment means. Substrate 38 is coupled to IC die 32 by means of bond wires 31. Those portions of substrate 38 that have been connected to IC die 32 serve as the I/O pins of completed IC package 30. The ground pads 40 on IC die 32 are coupled to the portion of substrate 38 that directly underlies IC die 32 by means of bond wires 36. Solder balls 39 are formed on the lower, exposed surfaces of substrate 38. When placed on a printed circuit board (PCB) and then heated in one of several known ways, solder balls 39 provide electrical connections with substrate 38. Solder balls 39 which directly underlie IC die 32 provide a direct pathway from the ground pads 40 of IC die 32 through substrate 38 and solder balls 39 into the PCB ground plane. This ground path offers very low inductance to the PCB ground plane and greatly reduces ground bounce.

The two different packages shown in FIGS. 1, 2a and 2b each solve different problems. The exposed die attach pad of the package shown in FIG. 1 offers significant heat sinking, which becomes increasingly important as IC operating speeds continue to increase. Indeed, the heat sinking capabilities of this type of package have been increased in some known packages by extending the die attach pad so that it protrudes outside of the package body. However, according to prior art, these protruding die attach pads are as yet restricted to protruding no further than the top surface of the PCB upon which they are mounted.

The package illustrated in FIGS. 2a and 2b provides a very low inductance ground pathway, which greatly reduces ground bounce while simultaneously reducing the number of leads required for ground connections.

An IC package which combines the advantages of the described prior art packages, without increasing the package manufacturing cost, would be a useful advance on known IC packages.

SUMMARY OF THE INVENTION

In each of its embodiments, the present invention comprises an IC package with a very low inductance ground path to a PCB ground plane, wherein the same structure that provides the low inductance ground path also provides a significantly improved thermal conduction path. A comparatively large metal die attach pad (metal slug), with protrudes outside of the IC package, is electrically connected to IC ground pads through its upper surface, and electrically connected to a PCB ground plane through its lower, exposed surface. This connection provides a very low inductance ground path from the IC die to the PCB ground plane, while also providing a highly efficient heat sink for the IC die. In several embodiments, the metal slug is made sufficiently thick so that it extends well outside of the IC package. In these embodiments, the metal slug is inserted into pre-defined and pre-cut holes in the PCB. When attaching the IC package to the PCB, these embodiments offer the additional advantage of self-alignment of the IC package pins with their corresponding PCB traces. To further improve the present invention's thermal conduction, in those embodiments where the metal slug extends through the PCB, a heat sink can also be attached to the exposed metal slug after insertion into the PCB.

BRIEF DESCRIPTION OF THE DRAWINGS

The invention, together with its various advantages, may be best understood by referring to the following description and accompanying drawings in which.

DETAILED DESCRIPTION OF THE INVENTION

Figure 3A:
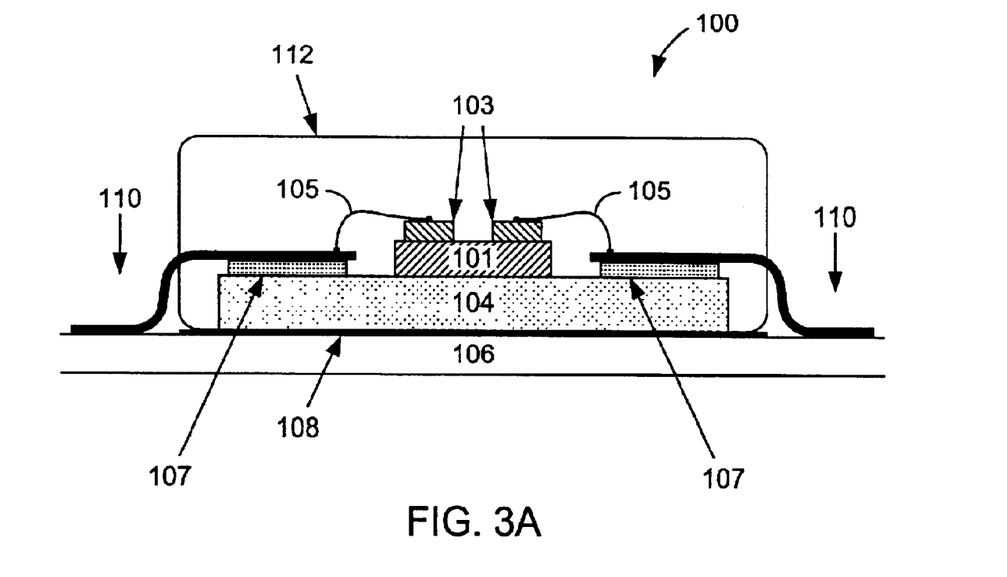
FIGS. 3a, 3b and 3c are, respectively, a first cross-sectional view, a second cross-sectional view, and a bottom view of the first embodiment of the present invention.
Figure 3B:
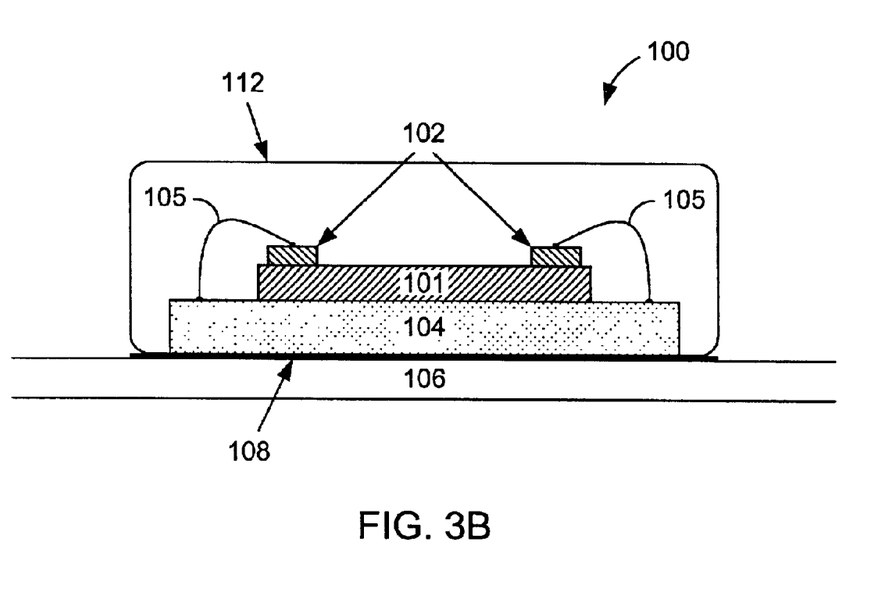
Figure 3C:
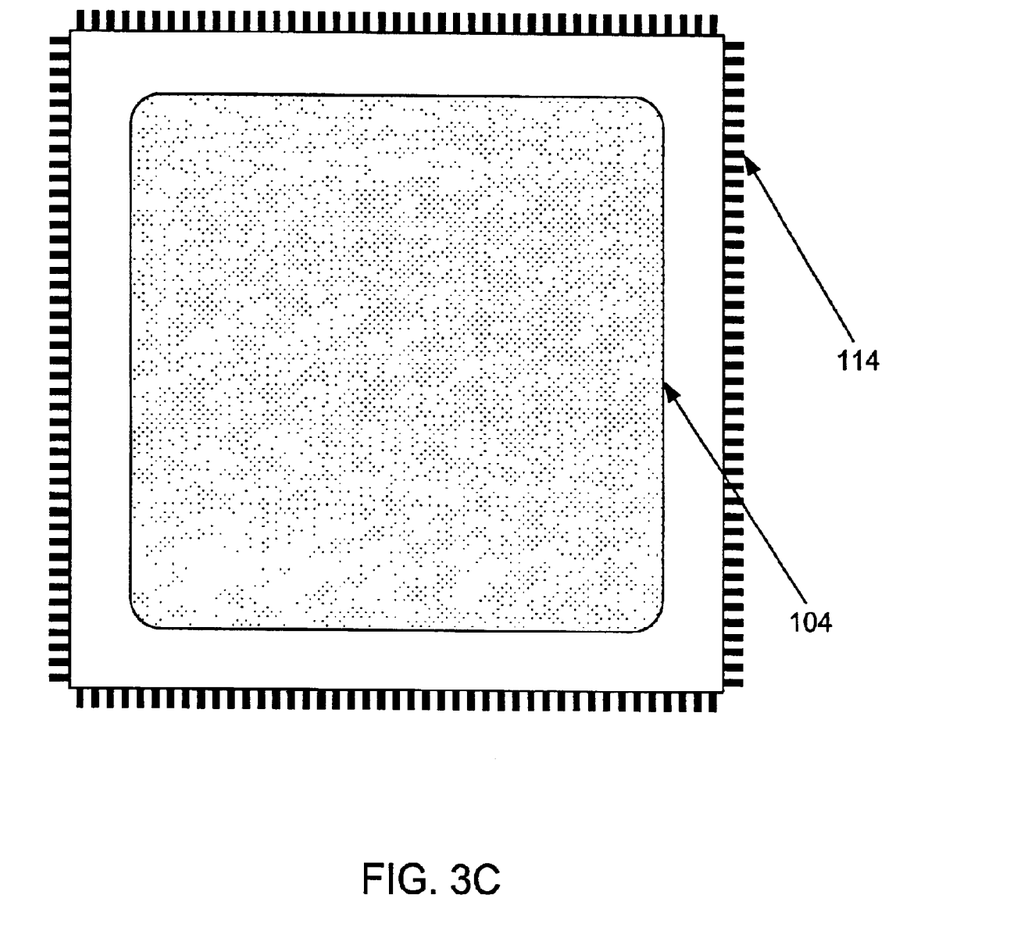

A first embodiment of the present invention is shown in FIGS. 3a, 3b and 3c. In this embodiment, a Plastic Quad Flat Package (PQFP) IC 100 is shown. Referring to FIG. 3a, metal lead frame 110, which is supported by spacers 107, provides the PQFP I/O pins. As shown in FIG. 3a, spacers 107 rest on a metal slug 104, which acts as a die attach pad. So that various embodiments of the present invention can be more clearly shown, metal lead frame 110 is not shown in the other figures illustrating this embodiment, and other embodiments, of the present invention. It should be understood that each embodiment of the present invention incorporates a lead frame for IC I/O signals. IC die 101 is electrically coupled to lead frame 110 by means of bond wires 105.

Referring to FIG. 3b, IC die 101 is mounted on the top surface of metal slug 104. IC die 101 is electrically connected to metal slug 104 using an electrically conductive medium such as silver epoxy or a solder preform. Ground pads 102 on IC die 101 are also electrically connected to the top surface of metal slug 104 by bond wires 105. Bond wires 105 are very short, with very low inductance, and are usually referred to as "downbonds". IC package body 112 is molded around the lead frame (not shown in FIG. 3b), IC die 101 and metal slug 104. As shown in FIG. 3a, at the end of the fabrication process, the lower surface of metal slug 104 is exposed and co-planar with the exposed leads of the PQFP. After PQFP 100 is complete, it is mounted on a PCB 106 whose top surface comprises a ground plane 108. An electrically conductive medium such as silver epoxy, PCB solder reflow, or a solder preform is used to electrically connect the lower surface of metal slug 104 with PCB ground plane 108.

FIG. 3c illustrates the bottom surface of a completed PQFP 100, including a plurality of package pins (signal leads) 114, on each side of the package. As shown in FIG. 3c, the lower surface of metal slug 104 is exposed.

As shown in FIGS. 3a, 3b and 3c, the X, Y dimensions of metal slug 104 are much greater than its thickness. This results in metal slug 104 having an effective inductance which is very nearly equal to zero. Furthermore, as shown in FIG. 3b, downbond wires 105 also have very low inductance because these wires are very short. In many applications, the very low inductance of these downbond wires can be reduced even further (made very close to zero) by connecting two or more downbond wires in parallel, to the same ground pad. (In this case, the ground pad must be made wider, but not taller).

Referring to FIG. 3b, the total inductance from any ground pad 102 to the PCB ground plane 108 is equal to the equivalent inductance of the downbond wire(s) 105 connected to ground pad 102, plus the inductance of metal slug 104. Since this total inductance is extremely low, it will considerably reduce the ground bounce on shared on-die ground pads and the ground lines connected to them.

Since all on-die ground pads 102 can be connected to PCB ground plane 108 through metal slug 104, no package pins or lead frame "fingers" 110 are needed in order to form these connections. Furthermore, since lead frame fingers 110 are usually the highest inductance component in the ground path, eliminating these fingers from the ground path significantly reduces the overall ground path inductance.

For those dies which contain very sensitive "small signal" analog circuitry, it is sometimes desirable to provide one or more "isolated" ground pads which are not connected to metal slug 104. Referring to FIG. 3a, these isolated ground pads can be connected in the same manner as normal I/O signal pins, by utilizing bondwire 105 and lead frame 110. Of course, since these isolated ground pads are connected to lead frame fingers, they will have high inductance in their ground path. This is usually not be a problem for "small signal" analog circuitry, however, because the ground line currents associated with this type of circuitry are often fairly low.

Referring to FIGS. 3a–3c, it can be seen that metal slug 104 provides a very efficient thermal heat sink for IC die 101. IC die 101 is directly attached to metal slug 104, which in turn is electrically and thermally coupled to the large PCB ground plane. These elements combine to form a significant thermal mass, which can absorb a great deal of the heat generated by IC die 101. Thus, in addition to significantly reducing ground path inductance, metal slug 104 also acts as a heatsink at no additional packaging cost.

As previously described, the first embodiment of the present invention assumes that the PCB ground plane is located on the top surface of the PCB. In those cases where the PCB ground plane is located within the PCB laminate, an array of small plated-thru vias can be used to couple the internal PCB ground plane to a PCB ground "pad" located on the top surface of the PCB. Because the inductance of a plated-thru via is relatively low, and because there are many of these vias in parallel, their total equivalent inductance will be extremely low.

Figure 4:
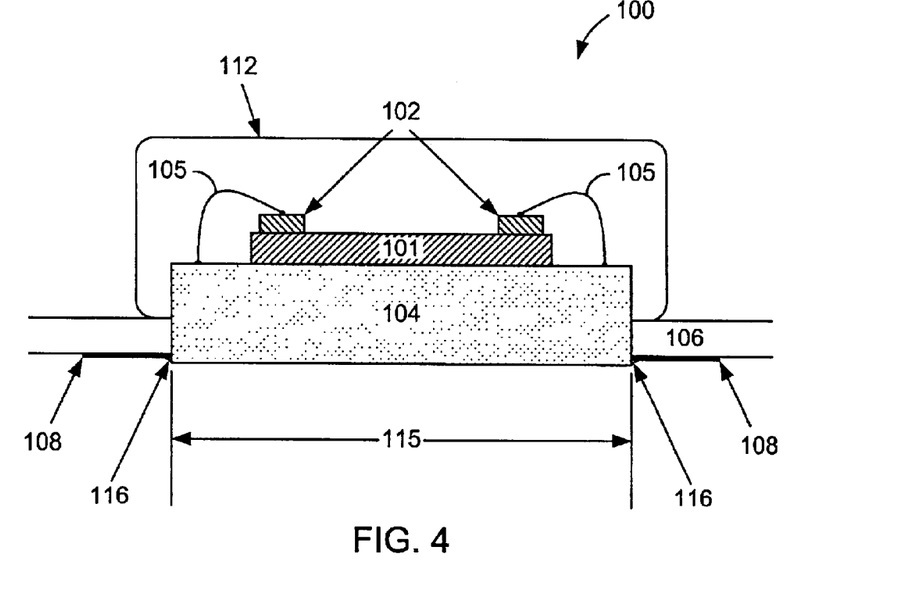
FIG. 4 is a cross-sectional view of a second embodiment of the present invention.

FIG. 4 illustrates a second embodiment of the present invention. Referring to FIG. 4, components which are similar or identical to those used in the first embodiment are numbered identically to those used in the first embodiment. (This same convention also applies to the description of all subsequent embodiments of the present invention, as described below).

As shown in FIG. 4, metal slug 104 is significantly thicker than the corresponding metal slug utilized in the first embodiment of the invention (as shown in FIG. 3b). Referring to FIG. 4, metal slug 104 has been made sufficiently thick so that it now extends be low the bottom surface of IC package 100 and through a cutout 115 in PCB 106. By examining FIGS. 3a and 4, it can be seen that the bottom surface of metal slug 104 extends below the plane formed by the bottom surfaces of the I/O lead frame fingers 100.

As shown in FIG. 4, cutout 115, of appropriate dimensions, has been made in PCB 106 during its manufacture. Referring to FIG. 4, cutout 115 has been made in PCB 106 so that metal slug 104 can be inserted into cutout 115. In this embodiment, wave soldering or another similar process would create solder filet 116, which physically and electrically attaches metal slug 104 to PCB ground plane 108.

As previously described in the first embodiment of the invention, the second embodiment of the invention, as shown in FIG. 4, maintains a very low inductance path to the PCB ground plane 108. Furthermore, the second embodiment of the invention offers several additional advantages. For example, since cutout 115 in PCB 106 closely matches the shape of metal slug 104, metal slug 104 will fit very snugly into cutout 115. This snug fit allows the pins on IC package 100 to be automatically aligned with their corresponding PCB solder "pads". Furthermore, because the bottom surface of metal slug 104 is exposed to the air, IC package 100 can be effectively cooled by airflow convection. Comparing IC package 100 (shown in FIG. 4) with prior art IC package 10 (shown in FIG. 1), it can be seen that the slug in IC package 10 cannot benefit from airflow convection cooling because its bottom surface is attached to the top surface of the PCB—i.e. the bottom surface of IC package 10 is not exposed to the air.

Figure 5:
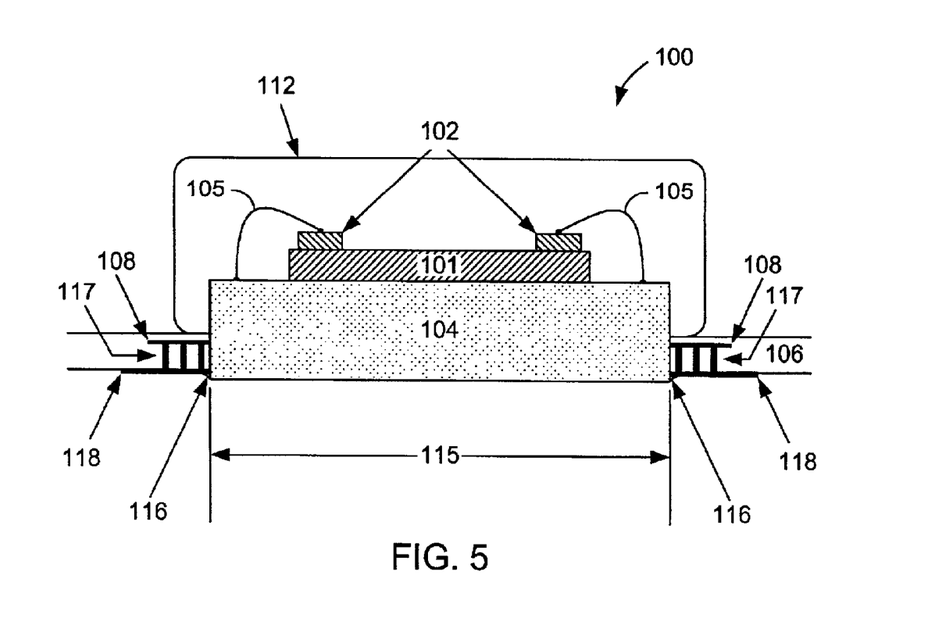
FIG. 5 is another cross-sectional view of the second embodiment of the present invention.
Figure 6:
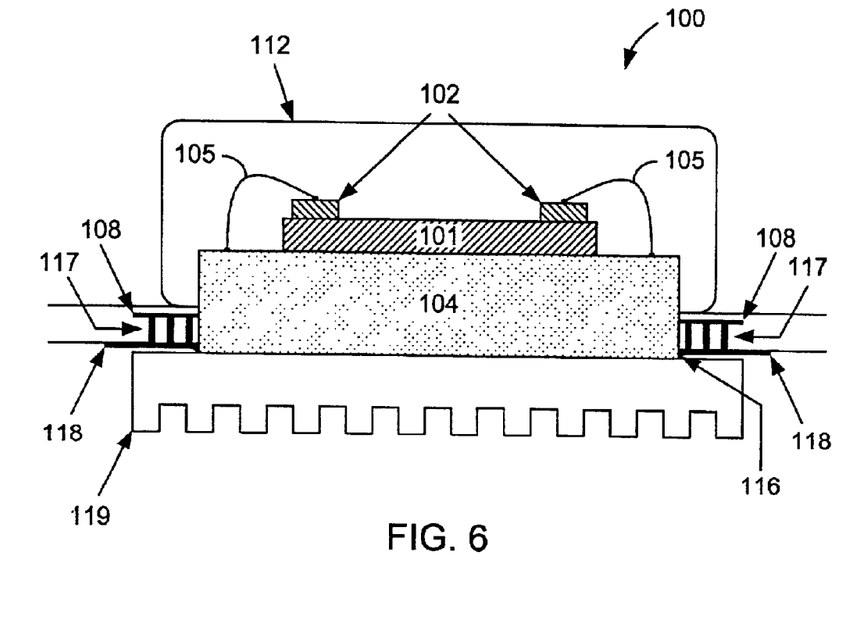
FIG. 6 is a cross-sectional view of yet another embodiment of the present invention.

The second embodiment of the invention, shown in FIG. 4, assumes that PCB ground plane 108 is located on the bottom surface of PCB 106. However, as shown in FIG. 5, in those applications where the PCB ground plane is located within the PCB laminate, an array of small plated-thru vias 117 can be utilized in order to connect internal PCB ground plane 108 to a PCB ground "pad" 118, located on the bottom surface of PCB 106. Since the inductance of via 117 is low, and because there are many vias in parallel, these vias collectively present a very low inductance path to ground. Finally, as shown in FIG. 6, the second embodiment of the invention can be modified by attaching a heat sink 119 to metal slug 104. Heat sink 119 further increases the amount of heat that can be dissipated in this embodiment of the invention.

The embodiments shown in FIGS. 4 and 5 can be fabricated by first preparing PCB 106 with appropriate cutouts 115. In the next step, IC package 100, with its extended metal slug, would be inserted into the prepared cutouts in PCB 106. In the final step, metal slug 104 can be attached to PCB ground (108 in FIG. 4, 118 in FIG. 5) by using wave soldering techniques, or by using an electrically conductive adhesive (such as silver epoxy), or by using solder reflow techniques. Referring to FIG. 6, when a heat sink must be attached to the metal slug, it can be affixed using any one of several known attachment methods, including thermally conductive adhesive, mechanical attachment using screws, or reflow solder techniques.

Figure 7A:
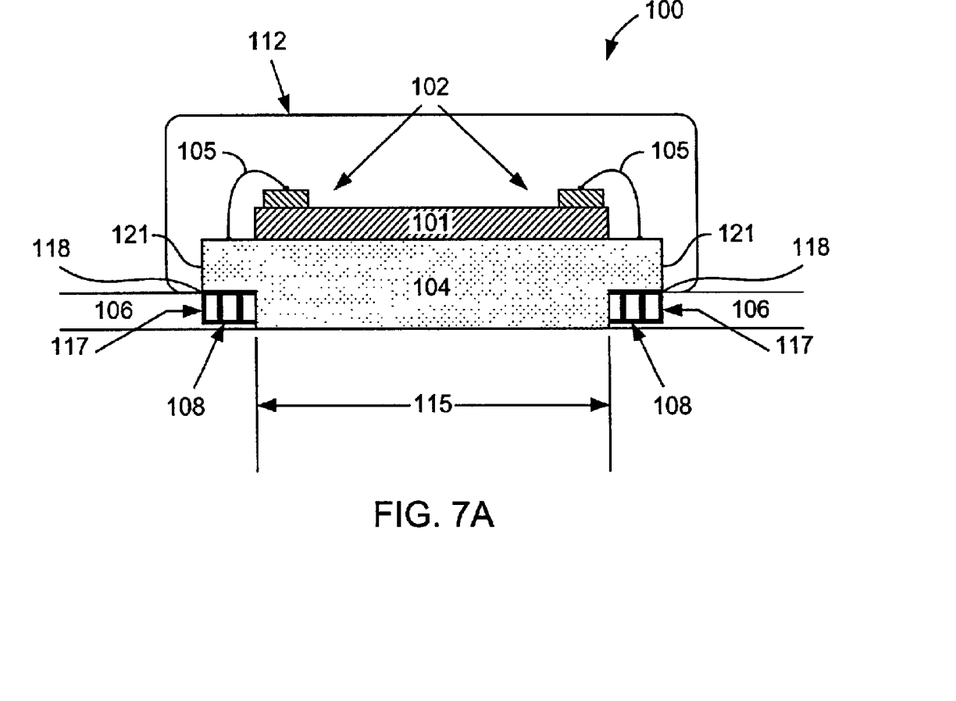
FIGS. 7a and 7b are cross-sectional views of other embodiments of the present invention.
Figure 7B:
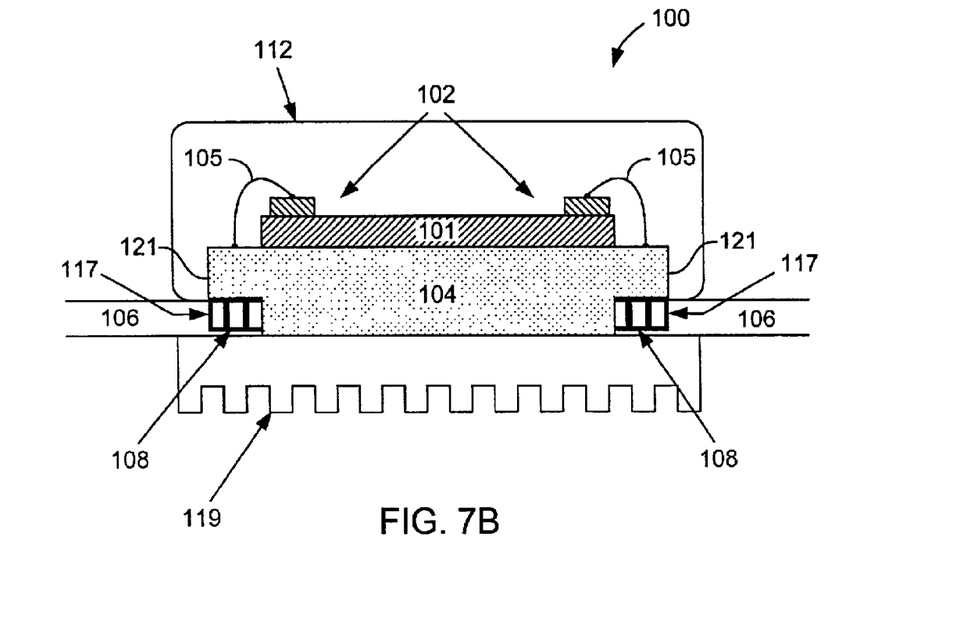

FIGS. 7a and 7b show two other embodiments of the present invention. In each of these embodiments, metal slug 104 has been shaped to have shoulder regions 121. These shoulder regions rest on the top surface of PCB 106, allowing metal slug 104 to be electrically and mechanically connected to a top surface PCB ground "pad" 118. This connection can be made using solder reflow techniques, or by means of an electrically conductive adhesive such as silver epoxy. In the embodiments shown in FIGS. 7a and 7b, the bottom surface of slug 104 can be coincident with the bottom surface of PCB 106.

Since the embodiment shown in FIG. 7a has a buried PCB ground plane 108, this ground plane is electrically connected to ground "pad" 118, on the top surface of PCB 106, by utilizing an array of vias 117, connected between PCB ground plane 108 and ground "pad" 118. Of course, in those cases where ground plane 108 is located on the top surface of PCB 106, vias 117 will not be required.

As shown in FIG. 7b, in order to maximize thermal heat sinking capacity, a heat sink 119 can be attached to metal slug 104, whose bottom surface extends through opening 115 in PCB 106. Referring to FIG. 7b, heat sink 119 can be attached to slug 104 using thermal grease and screws, or by using thermally conductive bonding agents.

In summary, all embodiments of the present invention provide a very low inductance ground path from the on-die ground pads to the PCB ground plane, through the use of short downbond wires to a metal slug, which acts as a very low inductance die attach pad (DAP) for the IC package. This very low inductance ground path can minimize electrical ground bounce to the point where it is no longer a significant problem. Furthermore, all embodiments of the present invention completely eliminate the need for dedicated ground pins on the IC package, significantly increasing the number of I/O pins available. In addition, by extending the thickness of the metal slug, and by providing cutouts in the PCB, all IC package pins can be automatically self-aligned to their corresponding PCB "pads". Finally, the thickness and size of metal slug 104 provide significant cooling capacity for the IC die. In those cases where maximum cooling capacity is needed, an external heat sink can be affixed to the package's exposed metal slug, which extends through the bottom surface of the PCB.

Although the present invention has been described in some detail for clarity of understanding, certain changes and modifications may be practiced within the scope of the appended claims. Therefore, the described embodiments should be taken as non restrictive illustrations only, and the invention should not be limited to the details presented herein, but should be defined by the following claims and the full scope of their equivalents.

What is claimed is:

1. A semiconductor package comprising:
    a metal slug having upper and lower surfaces;
    an integrated circuit die, mounted on the metal slug, the integrated circuit die having signal pads and ground pads;
    a lead frame having a plurality of leads; and
    a semiconductor package body, wherein signal pads on the integrated circuit die are coupled to leads on the lead frame, ground pads on the integrated circuit are coupled to the upper surface of the metal slug and the lower surface of the metal slug remains exposed and extends a predefined distance outside the semiconductor package, and wherein the predefined distance at least equals the thickness of a printed circuit board upon which the semiconductor package is mounted, the metal slug extending through a cutout in the printed circuit board and being coupled to at least a first ground plane in the printed circuit board.

2. The semiconductor package of claim 1 wherein the lower surface of the metal slug is electrically coupled to a ground plane exposed on a bottom surface of a printed circuit board.

3. The semiconductor package of claim 1 wherein the lower surface of the metal slug is electrically coupled to a ground pad on a top surface of a printed circuit board, the ground pad further being electrically coupled to a ground plane within the printed circuit board by plated-through vias.

4. The semiconductor package of claim 1 wherein a heat sink is attached to the lower surface of the metal slug after it has been extended through the cutout in the printed circuit board.

5. An integrated circuit package with a metal slug, the metal slug comprising:
    an upper surface upon which a semiconductor die is mounted and to which ground pads on the semiconductor die arc electrically coupled, and a lower surface extending at least until it is exposed and co-planar with an exterior surface of the integrated circuit package, wherein the metal slug is extended so that it can be inserted through a predefined cutout in a printed circuit board upon which the integrated circuit package is mounted, the lower surface of the metal slug being exposed after the integrated circuit package has been inserted into the cutout.

6. The integrated circuit package of claim 5 wherein the lower surface of the metal slug is electrically coupled to a ground plane on a top surface of a printed circuit board, upon which printed circuit board the integrated circuit package is mounted.

7. The integrated circuit package of claim 5 wherein the lower surface of the metal slug is electrically coupled to a ground plane within a printed circuit board by means of vias through the printed circuit board and a surface ground pad on a top surface of the printed circuit board, the vias coupling the ground plane to the surface ground pad and the lower surface being electrically coupled to the surface ground pad.

8. The integrated circuit package of claim 5 wherein a heat sink is attached to the exposed lower surface of the metal slug after it has been extended through the printed circuit board.

* * * * *

UNITED STATES PATENT AND TRADEMARK OFFICE
CERTIFICATE OF CORRECTION

PATENT NO. : 6,710,432 B1
DATED : March 23, 2004
INVENTOR(S) : Ronald Pasqualini It is certified that error appears in the above-identified patent and that said Letters Patent is hereby corrected as shown below:

Column 1,
Line 19, add -- die -- after "of a" to read -- of a die attach --.
Line 22, change "an" to -- and -- to read -- and lead frame --.

Column 3,
Line 60, change "arc" to -- are -- to read -- wires are very --.

Column 4,
Line 55, change "be low" to -- below -- to read -- extends below --.
Line 59, change "100" to -- 110 -- to read -- lead frame fingers 110 --.

Column 6,
Line 67, change "arc" to -- are -- to read -- semiconductor die are electronically --.

Signed and Sealed this

Twenty-third Day of November, 2004

JON W. DUDAS
*Director of the United States Patent and Trademark Office*